United States Patent
Hayashi (10) Patent No.: US 8,425,013 B2
(45) Date of Patent: Apr. 23, 2013

(54) PIEZOELECTRIC ACTUATOR, LIQUID EJECTION HEAD, AND IMAGE FORMING APPARATUS

(75) Inventor: Keisuke Hayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 12 days.

(21) Appl. No.: 13/151,506

(22) Filed: Jun. 2, 2011

(65) Prior Publication Data

US 2011/0298872 A1    Dec. 8, 2011

(30) Foreign Application Priority Data

Jun. 8, 2010 (JP) ................................. 2010-131532

(51) Int. Cl.
*B41J 2/045* (2006.01)
(52) U.S. Cl.
USPC .................... 347/68; 347/70; 347/71; 347/72
(58) Field of Classification Search ............... 347/68–72
See application file for complete search history.

(56) References Cited

U.S. PATENT DOCUMENTS

| | | | |
|---|---|---|---|
| 4,293,865 A * | 10/1981 | Jinnai et al. | 347/48 |
| 5,245,244 A * | 9/1993 | Takahashi et al. | 310/328 |
| 5,475,407 A * | 12/1995 | Ohashi | 347/69 |
| 5,508,726 A * | 4/1996 | Sugahara | 347/68 |
| 5,657,063 A * | 8/1997 | Takahashi | 347/69 |
| 5,801,731 A * | 9/1998 | Takahashi | 347/69 |
| 6,286,943 B1 * | 9/2001 | Ashe et al. | 347/71 |
| 6,367,916 B2 * | 4/2002 | Asano | 347/69 |
| 6,505,918 B1 * | 1/2003 | Condie et al. | 347/69 |
| 6,618,943 B2 * | 9/2003 | Ashe et al. | 29/890.1 |
| 7,249,816 B2 * | 7/2007 | Kusunoki et al. | 347/10 |
| 7,651,205 B2 | 1/2010 | Hayashi | |
| 7,871,153 B2 | 1/2011 | Hayashi | |
| 2009/0002460 A1 | 1/2009 | Hayashi | |

FOREIGN PATENT DOCUMENTS

| | | |
|---|---|---|
| JP | 8-142325 | 6/1996 |
| JP | 3546430 | 4/2004 |

* cited by examiner

*Primary Examiner* — Matthew Luu
*Assistant Examiner* — Henok Legesse
(74) *Attorney, Agent, or Firm* — Cooper & Dunham LLP (57) ABSTRACT

A piezoelectric actuator includes a piezoelectric member having piezoelectric pillars and grooves alternately arrayed. Each of the grooves has a first width at a bottom side of the piezoelectric pillars and a second width at an upper side of the piezoelectric pillars in a direction in which the piezoelectric pillars are arrayed. The first width is greater than the second width.

11 Claims, 11 Drawing Sheets

PIEZOELECTRIC ACTUATOR, LIQUID EJECTION HEAD, AND IMAGE FORMING APPARATUS

CROSS-REFERENCE TO RELATED APPLICATIONS

The present patent application claims priority pursuant to 35 U.S.C. §119 from Japanese Patent Application No. 2010-131532, filed on Jun. 8, 2010 in the Japan Patent Office, which is hereby incorporated herein by reference in its entirety.

BACKGROUND

1. Technical Field

This disclosure relates to a piezoelectric actuator, a liquid ejection head, and an image forming apparatus.

2. Description of the Background Art

Image forming apparatuses are used as printers, facsimile machines, copiers, plotters, or multi-functional devices having two or more of the foregoing capabilities. As one type of image forming apparatuses are known inkjet-type image forming apparatuses (inkjet recording apparatus) using a recording head formed with a liquid ejection head (liquid-droplet ejection head). During image formation, such inkjet-type image forming apparatuses eject droplets of ink or other liquid from the recording head onto a recording medium to form a desired image.

Such inkjet-type image forming apparatuses fall into two main types: a serial-type image forming apparatus that forms an image by ejecting droplets from the recording head while moving the recording head in a main scanning direction of the carriage, and a line-head-type image forming apparatus that forms an image by ejecting droplets from a linear-shaped recording head held stationary in the image forming apparatus.

As the liquid ejection head, for example, a piezoelectric head like that described in JP-08-142325-A is known that includes a piezoelectric member serving as a pressure generator to press ink in liquid chambers to generate pressure to the ink, in particular, a piezoelectric actuator having a plurality of pillar-shaped piezoelectric elements (piezoelectric pillars) formed by groove-processing a laminated piezoelectric member in which piezoelectric layers and internal electrodes are alternately laminated. The laminated piezoelectric elements are deformed in the d33 or d31 direction to deform elastic diaphragms. As a result, the internal volume and pressure of liquid chambers are changed to eject liquid droplets.

In a piezoelectric actuator used in a conventional liquid ejection head like that described in JP-3546430, for example, the width of a plurality of piezoelectric pillars in a direction perpendicular to a direction in which the piezoelectric pillars are arrayed is greater at an upper side than at a bottom (lower) side.

For such image forming apparatuses, downsizing of liquid droplets and increasing of the nozzle array density have been made to obtain high-quality images. Further, to enhance the image formation speed, the driving frequency of the liquid ejection head has been increased or the length of the liquid ejection head has been increased with an increased number of nozzles per head as in line-type liquid ejection heads.

To produce such a highly-integrated head, it is preferable that, in the formation of multiple piezoelectric pillars, the width of the piezoelectric pillars in the direction in which the piezoelectric pillars are arrayed (hereinafter, the term "width" represents a width in the above-mentioned direction), the pitch of grooves processed, and the width of grooves are small while the depth of the grooves (the height of the piezoelectric pillars) is great so as to form a high aspect ratio. However, in such a case, the piezoelectric pillars may be inclined in the groove processing.

To prevent such inclination of piezoelectric pillars, it is conceivable to increase the width of piezoelectric pillars to enhance the hardness of piezoelectric pillars. However, in such a configuration, a relatively-thin blade need be used in groove processing, thus requiring an increased hardness of the blade. By contrast, if a thick blade is used, the width of piezoelectric pillars becomes small. However, in such a case, the hardness of piezoelectric pillars may be insufficient, causing the inclination of piezoelectric pillars. Further, such insufficient hardness of the piezoelectric pillars may cause a reduced performance of actuators.

In addition, the more the bonded area between the piezoelectric pillars and the diaphragms (deformation members) deformed by the piezoelectric pillars, the more tolerant the actuator to misalignment of the bonded area, thus obtaining enhanced reliability. Further, the more the bonded area between the piezoelectric pillars and the diaphragms, the greater deformation force can be applied to the diaphragms. Accordingly, even if multiple nozzles are arrayed at high density, it is preferable to obtain a large bonded area between the piezoelectric pillars and the diaphragms.

BRIEF SUMMARY

In an aspect of this disclosure, there is provided an improved piezoelectric actuator including a piezoelectric member having piezoelectric pillars and grooves alternately arrayed. Each of the grooves has a first width at a bottom side of the piezoelectric pillars and a second width at an upper side of the piezoelectric pillars in a direction in which the piezoelectric pillars are arrayed. The first width is greater than the second width.

In another aspect of this disclosure, there is provided an improved liquid ejection head including a piezoelectric actuator. The piezoelectric actuator includes a piezoelectric member having piezoelectric pillars and grooves alternately arrayed. Each of the grooves has a first width at a bottom side of the piezoelectric pillars and a second width at an upper side of the piezoelectric pillars in a direction in which the piezoelectric pillars are arrayed. The first width is greater than the second width.

In still another aspect of this disclosure, there is provided an improved image forming apparatus including a liquid ejection head. The liquid ejection head has a piezoelectric actuator. The piezoelectric actuator includes a piezoelectric member having piezoelectric pillars and grooves alternately arrayed. Each of the grooves has a first width at a bottom side of the piezoelectric pillars and a second width at an upper side of the piezoelectric pillars in a direction in which the piezoelectric pillars are arrayed. The first width is greater than the second width.

BRIEF DESCRIPTION OF THE DRAWINGS

The aforementioned and other aspects, features, and advantages will be better understood by reference to the following detailed description when considered in connection with the accompanying drawings, wherein.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION OF EXEMPLARY EMBODIMENTS

In describing embodiments illustrated in the drawings, specific terminology is employed for the sake of clarity. However, this patent specification is not intended to be limited to the specific terminology so selected and it is to be understood that each specific element includes all technical equivalents that operate in a similar manner and achieve similar results.

In this disclosure, the term "image forming apparatus" refers to an apparatus (e.g., liquid ejection apparatus or droplet ejection apparatus) that ejects ink or any other liquid on a medium to form an image on the medium. The medium is made of, for example, paper, string, fiber, cloth, leather, metal, plastic, glass, timber, and ceramic. The term "image formation", which is used herein as a synonym for "image recording" and "image printing", includes providing not only meaningful images such as characters and figures but meaningless images such as patterns to the medium. The term "ink" used herein is not limited to "ink" in a narrow sense and includes anything useable for image formation, such as a DNA sample, resist, pattern material, washing fluid, storing solution, and fixing solution. The term "image" used herein is not limited to a two-dimensional image and includes, for example, an image applied to a three dimensional object and a three dimensional object itself formed as a three-dimensionally molded image. The term "sheet" used herein is not limited to a sheet of paper and includes anything such as an OHP (overhead projector) sheet or a cloth sheet on which ink droplets are attached. In other words, the term "sheet" is used as a generic term including a recording medium, a recorded medium, or a recording sheet.

Although the exemplary embodiments are described with technical limitations with reference to the attached drawings, such description is not intended to limit the scope of the invention and all of the components or elements described in the exemplary embodiments of this disclosure are not necessarily indispensable to the present invention.

Referring now to the drawings, wherein like reference numerals designate identical or corresponding parts throughout the several views, exemplary embodiments of this disclosure are described below.

Figure 1:
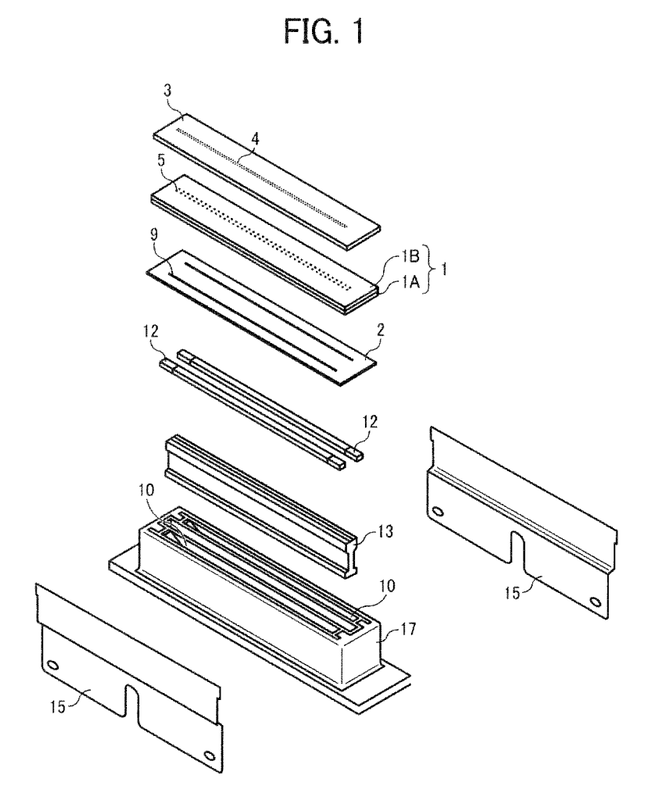
FIG. 1 is an exploded perspective view of a liquid ejection head according to an exemplary embodiment of this disclosure.
Figure 2:
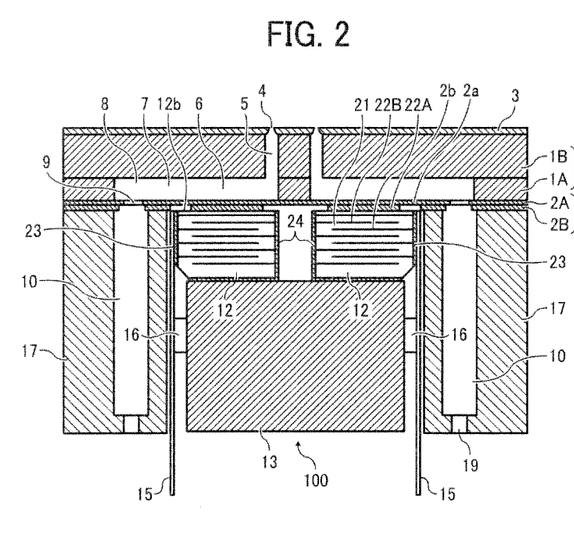
FIG. 2 is a sectional view of the liquid ejection head cut along a long direction of chambers.
Figure 3:
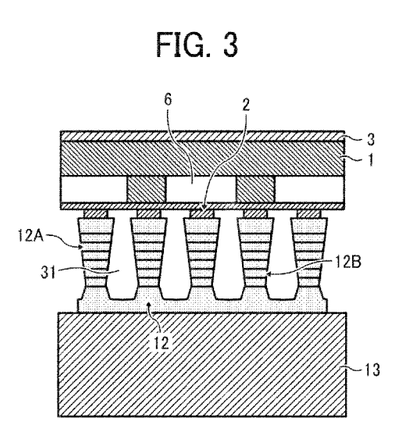
FIG. 3 is a sectional view of a configuration of the liquid ejection head cut along a short direction of chambers.
Figure 4:
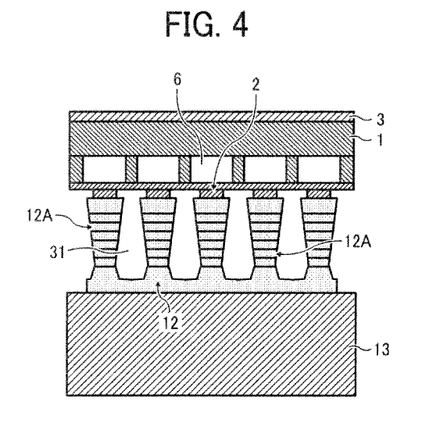
FIG. 4 is a sectional view of another configuration of the liquid ejection head cut along a short direction of chambers.

First, a liquid ejection head according to an exemplary embodiment of this disclosure with reference to FIGS. 1 to 4. FIG. 1 is an exploded perspective view of the liquid ejection head. FIG. 2 is a sectional view of the liquid ejection head cut along a direction perpendicular to a direction (hereinafter, nozzle array direction) in which multiple nozzles of the head are arrayed (i.e., a long direction of chambers of the head). FIGS. 3 and 4 are sectional views of different configurations of the liquid ejection head cut along the nozzle array direction of the liquid ejection head.

The liquid ejection head includes a channel plate 1 (also referred to as channel substrate or chamber substrate) made of a stainless steel (SUS) substrate, a diaphragm member 2 bonded to a lower face of the channel plate 1, and a nozzle plate 3 bonded to an upper face of the channel plate 1. A plurality of pressure chambers 6, a plurality of fluid resistance portions 7, and a plurality of connecting portions 8 are formed in the channel plate 1, the diaphragm member 2, and the nozzle plate 3. The plurality of liquid chambers 6 (also referred to as pressurizing chambers, pressure rooms, pressurizing rooms, or channels) serves as separate channels connected via corresponding nozzle channels 5 to multiple nozzles 4 formed in the nozzle plate 3 from which ink droplets are ejected. While receiving resistance by the fluid resistance portions 7, ink is supplied to the liquid chambers 6 through the fluid resistance portions 7 serving as supply channels. The connecting portions 8 are connected to the liquid chambers 6 via the fluid resistance portions 7. From common chambers 10 formed in a frame member 17, ink is supplied to the connecting portions 8 through supply ports 9 formed in the diaphragm member 2.

The channel plate 1 includes a first channel plate member 1A and a second channel plate member 1B bonded together. For the channel plate 1, a SUS substrate is etched with an acidic etching solution or machined by e.g., punching or pressing to form the nozzle channels 5, the pressure chambers 6, and resistance portions 7.

The diaphragm member 2 includes a first layer 2A and a second layer 2B. A thin portion of the diaphragm member 2 is formed of the first layer 2A, and a thick portion of the diaphragm member 2 is formed of the first layer 2A and the second layer 2B. The diaphragm member 2 includes a plurality of vibration areas (diaphragm portions) 2a formed of the first layer 2A and forming part of walls of the corresponding chambers 6. The vibration areas 2a include convex portions 2b arranged in islands and formed of the thick portions (which are formed of the first layer 2A and the second layer 2B) at an outer-face side of the vibration areas 2a (i.e., the opposite side of the liquid chambers 6). The convex portions 2b are bonded to piezoelectric actuators 100 including electro-mechanical transducers serving as driving units (actuator units or pressure generation units) to deform the vibration areas 2a.

The piezoelectric actuators 100 includes a plurality of (two in FIG. 1) laminated piezoelectric members 12 bonded on a base member 13 with glue. Each of the piezoelectric members 12 is groove-processed by half-cut dicing to form a desired number of the piezoelectric pillars 12A and 12B at certain intervals in the form of comb. The piezoelectric pillars 12A and 12B of the piezoelectric members 12 have substantially identical configurations and differ in that driving waveform is applied to the piezoelectric pillars 12A to drive it while no driving waveform is applied to the piezoelectric pillars 12B so that the piezoelectric pillars 12B are used simply as support pillars. In FIG. 2, a top face (bonded face) of each of the driven piezoelectric pillar 12A is bonded to the corresponding one of the convex portions 2b of the diaphragm member 2.

In each of the piezoelectric members 12, a piezoelectric material layer 21 and one of internal electrodes 22A and 22B are alternately laminated. The internal electrodes 22A and 22B are drawn out to end faces, that is, side faces of each piezoelectric member 12 substantially perpendicular to the diaphragm member 2 (i.e., parallel to a direction in which the internal electrodes 22A and 22B are laminated) and connected to end-face electrodes (external electrodes) 23 and 24 formed on the side faces. Applying voltages to the end-face electrodes 23 and 24 cause deformation in a laminated direction of the piezoelectric members 12.

Further, flexible print circuits (FPCs) 15 serving as flexible power-feed member (wiring member) to transmit driving signals are connected to the driven piezoelectric pillars 12A. Each FPC 15 is mounted with a driver integrated circuit (IC) to transmit driving waveforms to the driven piezoelectric pillars 12A and fixed to the base member 13 with hot-melt glue 16.

As described above, in this exemplary embodiment, the piezoelectric pillars 12A and 12B of the piezoelectric members 12 have substantially identical configurations, and a driving waveform is applied to the piezoelectric pillars 12A to drive it while no driving waveform is applied to the piezoelectric-pillars 12B so that the piezoelectric pillars 12B are used simply as support pillars. Further, in FIG. 3, a bi-pitch configuration is employed in which the driven piezoelectric pillars 12A and the non-driven piezoelectric pillars 12B are alternately arranged. Alternatively, as illustrated in FIG. 4, a normal-pitch configuration may be employed in which all piezoelectric pillars are used as the driven piezoelectric pillars 12A.

The nozzle plate 3 is formed from a metal plate of, e.g., nickel (Ni) by electroforming. The nozzle plate 3 has the nozzles 4 of a diameter of, e.g., 10 to 35 μm corresponding to the respective pressure chambers 6 and are bonded to the channel plate 1 with glue. A liquid-repellent layer is formed on a droplet-ejection face of the nozzle plate 3 (a front-side face in a direction in which ink droplets are ejected from the nozzle plate 3) opposite a face facing the pressure chambers 6.

The piezoelectric actuator 100 includes the piezoelectric members 12, the base member 13, and the FPCs 15. Further, at the outer side of the piezoelectric actuator 100 is provided the frame member 17 that is formed by injection molding of, for example, epoxy resin or polyphenylene sulfite. The above-mentioned common chambers 10 are formed in the frame member 17. Supply ports 19 are formed in the frame member 17 to supply ink or other recording liquid from external ink-supply sources to the common chambers 10 and connected to the ink-supply sources, such as ink cartridges and sub tanks.

In the liquid ejection head having such a configuration, for example, when the head is driven according to a so-called push ejection method, a controller causes driving pulse voltages of, e.g., 20V to 50V to be selectively applied to the driven piezoelectric pillars 12A in accordance with a desired image to be recorded. As a result, the piezoelectric pillars 12A are deformed so as to deform the vibration areas 2a of the diaphragm member 2. Thus, the capacity (volume) of the liquid chambers 6 is changed to pressurize liquid in the liquid chambers 6, thus ejecting liquid droplets from the nozzles 4 of the nozzle plate 3. When liquid droplets are ejected from the nozzles 4, the pressure in the liquid chambers 6 decreases and a slight amount of negative pressure is generated in the liquid chambers 6 by a liquid flow created by the droplet ejection. At this state, when the voltage application to the piezoelectric pillars 12A is turned off, the diaphragm member 2 returns to the original position and the liquid chambers 6 restores the original shape, thus generating an additional negative pressure. At this time, the recording liquid is replenished from the common chamber 10 to the liquid chambers 6, and liquid droplets are ejected from the nozzles 4 by the following driving-pulse application.

It is to be noted that, for example, a pull ejection method (in which the diaphragm member 2 is pulled and released so as to pressurize the recording liquid by the restoration force) or a pull-push ejection method (in which the diaphragm member 2 is held at an intermediate position, pulled from the position, and pushed in the droplet-ejection direction) may be employed instead of the above-described push ejection method.

Next, a first exemplary embodiment of the piezoelectric actuator 100 is described with reference to FIGS. 5 to 8.

Figure 5:
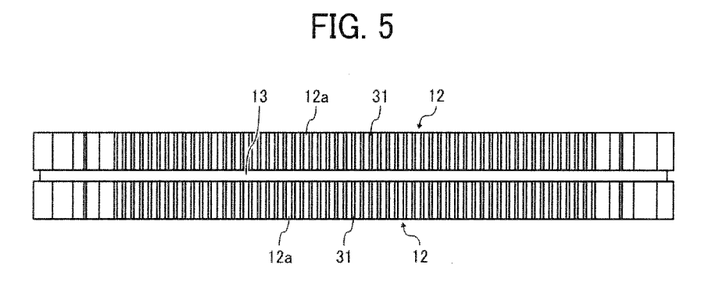
FIG. 5 is a plan view of a piezoelectric actuator according to an exemplary embodiment of this disclosure.
Figure 6:
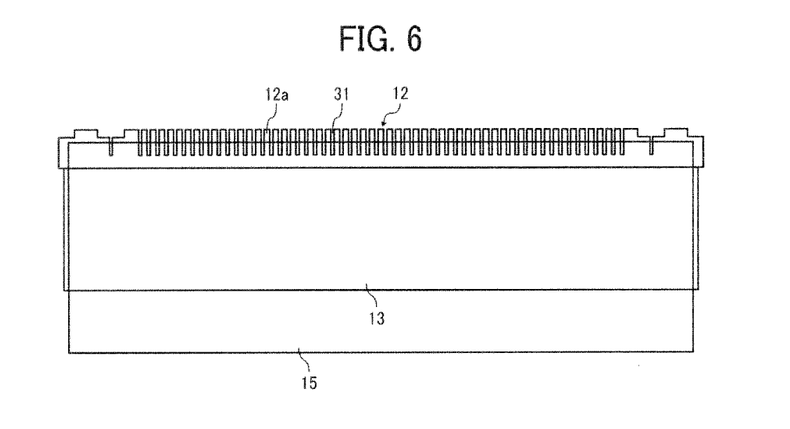
FIG. 6 is a front view of the piezoelectric actuator.
Figure 7:
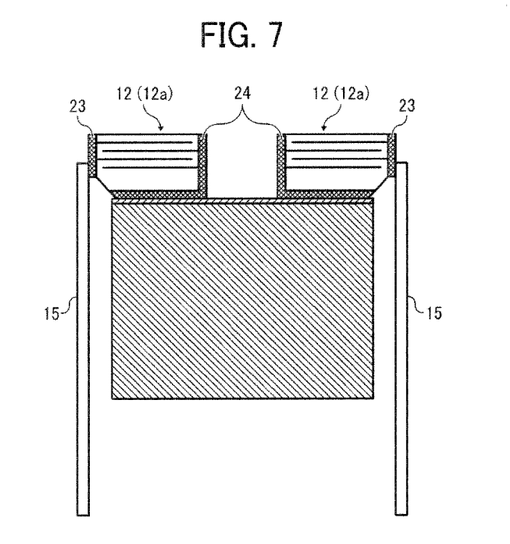
FIG. 7 is a side view of the piezoelectric actuator.
Figure 8:
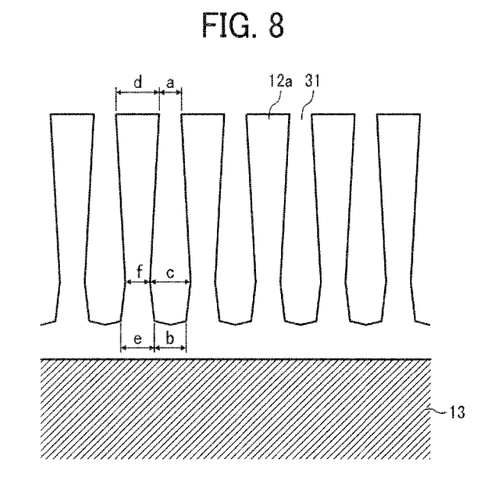
FIG. 8 is an enlarged front view of a portion of the piezoelectric actuator.

FIG. 5 is a schematic plan view of the piezoelectric actuator 100. FIG. 6 is a schematic front view of the piezoelectric actuator 100. FIG. 7 is a side view of the piezoelectric actuator 100. FIG. 8 is a partially-enlarged front view of the piezoelectric actuator 100.

In the piezoelectric actuator 100, the piezoelectric members 12 are arranged in parallel and fixed with an acrylic anaerobic adhesive on the base member 13 formed of a SUS 430 or other material. In the piezoelectric members 12, a plurality of piezoelectric pillars 12a is formed with grooves 31 (hereinafter the term "piezoelectric pillars 12a" is used to collectively refer to the piezoelectric pillars 12A and 12B). The FPC 15 are connected to the driving piezoelectric pillars 12A of the piezoelectric pillars 12a.

Here, as illustrated in FIG. 8, the grooves 31 between the piezoelectric pillars 12a have a greater width "b" a bottom side of the piezoelectric pillars 12a (proximal to the base member 13 in FIG. 8) than a width "a" at an upper side of the piezoelectric pillars 12a (distal to the base member 13 in FIG. 8) (b>a), and a greater width "c" at an intermediate position corresponding to an intermediate portion of the piezoelectric pillars 12a than the width b (c>b). In other words, the piezoelectric pillars 12a have a greater width "d" at an upper side thereof than a width "e" at a bottom side thereof (d>e), and a smaller width "f" at an intermediate portion thereof than the width "e" at the bottom side thereof (e>f).

Even in a case in which the piezoelectric pillars 12a are arranged at a high density, the above-described configuration can obtain a relatively large bonded area between the driven piezoelectric pillars 12A of the piezoelectric pillars 12a and the vibration areas 2a of the diaphragm member 2, thus enhancing the performance of the actuator.

Figure 9:
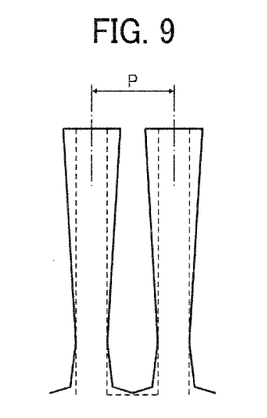
FIG. 9 is an enlarged front view of a portion of the piezoelectric actuator.

In other words, for example, as illustrated in FIG. 9, in a case in which the piezoelectric pillars 12a are arranged at a nozzle array pitch P, the width "a" of the grooves 31 at the upper side of the piezoelectric pillars 12a can be set smaller as indicated by a solid line of FIG. 9 than in a comparative case in which the piezoelectric pillars 12a are partitioned with the grooves 31 of a linear shape as indicated by a dashed line in FIG. 9. Accordingly, since the upper width of the piezoelectric pillars 12a can be set relatively great, the deformation force of the piezoelectric pillars 12a can be effectively transmitted to the vibration areas 2a, thus enhancing the droplet ejection performance.

For example, in the case in which the grooves 31 have a linear shape, i.e., a constant width from the upper side of the piezoelectric pillars 12a to the bottom side of the piezoelectric pillars 12a, if the grooves 31 of the linear shape are formed at the width "a" of the piezoelectric pillars 12a used in the present exemplary embodiment, a relatively-thin blade need be used for groove processing, thus requiring an increased hardness of the blade.

Next, a piezoelectric actuator according to a second exemplary embodiment of this disclosure is described with reference to FIG. 10.

Figure 10:
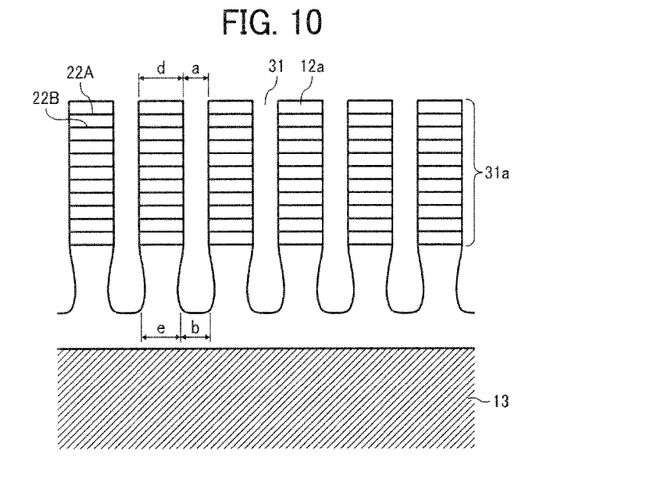
FIG. 10 is an enlarged front view of a portion of a piezoelectric actuator according to an exemplary embodiment of this disclosure.

FIG. 10 is an enlarged front view of a portion of the piezoelectric actuator. In this exemplary embodiment, as illustrated in FIG. 10, the width of the grooves 31 is constant at an area 31a from the upper side of the piezoelectric pillars 12a to a certain depth position and is greater at the deepest area than the area 31a. Thus, the grooves 31 between the piezoelectric pillars 12a have a greater width "b" at the bottom side of the piezoelectric pillars 12a than a width "a" at the upper side of the piezoelectric pillars 12a (b>a). In other words, the piezoelectric pillars 12a have a greater width "d" at the upper side thereof than a width "e" at the bottom side thereof (d>e).

Such a configuration can also obtain an effect equivalent to that of the first exemplary embodiment, and the linear portions of the grooves can minimize variation in the shape of the piezoelectric pillars, thus allowing uniform deformation of the piezoelectric pillars. In particular, in the laminated piezoelectric member, as illustrated in FIG. 10, by forming the internal electrodes in the linear portion, the deformable area entirely has a constant width, thus allowing uniform deformation.

Next, connection between the piezoelectric actuator and the power feed members is described with reference to FIGS. 11 and 12.

Figure 11:
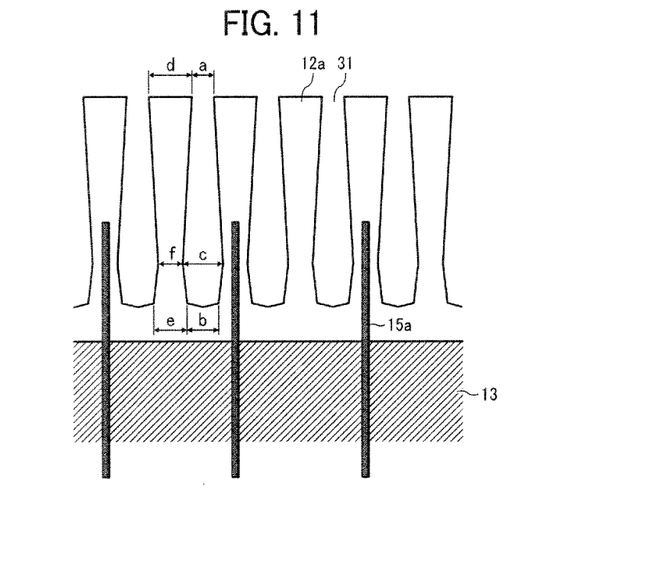
FIG. 11 is an enlarged front view of a piezoelectric actuator having a bi-pitch configuration connected to a power feed member.
Figure 12:
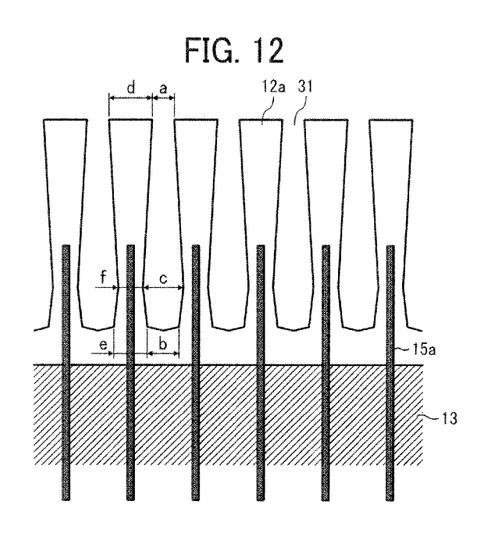
FIG. 12 is an enlarged front view of a piezoelectric actuator having a normal-pitch configuration connected to a power feed member.

FIG. 11 shows an example of a bi-pitch configuration. FIG. 12 shows an example of a normal pitch configuration First, external electrodes, not illustrated, are separately formed corresponding to the piezoelectric pillars 12a on bonded faces of the laminated piezoelectric member 12 with the FPCs 15. Wiring electrodes 15a of each FPC 15 serving as the power feed member are connected by soldering to areas lower than the center positions of the piezoelectric pillars 12a in the height direction of the piezoelectric pillars 12a and include at least relatively-thin portions of the piezoelectric pillars 12a. Alternatively, the wiring electrodes 15a may be connected by wire bonding to the lower areas of the piezoelectric pillars 12a.

Figure 13:
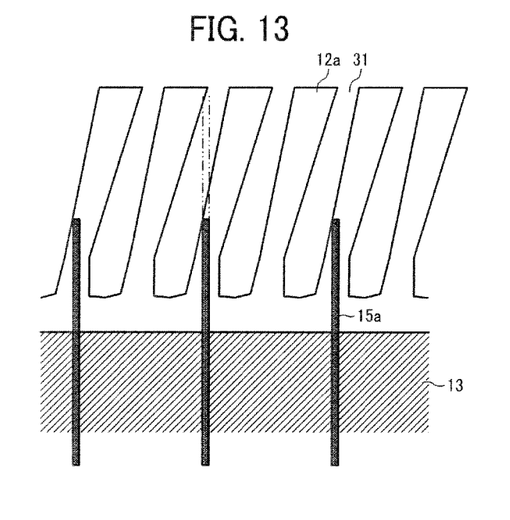
FIG. 13 is an enlarged front view of inclined piezoelectric pillars connected to a power feed member.

As described above, in the case in which the wiring electrodes 15a of the power feed members are connected to the lower areas of the piezoelectric pillars 12a, even if the piezoelectric pillars 12a are slightly inclined due to variation in the setting position during groove processing as illustrated in FIG. 13, the above-described configuration can prevent short circuit caused by, for example, misalignment of the FPC 15 bonded to the piezoelectric member 12. In other words, in FIG. 13, if the electrodes are extended to upper portions of the piezoelectric pillars 12a as indicated by a chained line in FIG. 13, the piezoelectric pillars 12a might contact adjacent wiring electrodes 15a. By contrast, as illustrated in FIG. 13, the above-described configuration can prevent such contact, thus preventing short circuit.

Next, another example of the connection between the piezoelectric actuator and the power feed members is described with reference to FIG. 14.

In this example, the wiring electrodes 15a of the FPCs 15 serving as the power feed members are connected by soldering to the bottom side of the piezoelectric pillars 12a instead of the above-described relatively-thin portions of the piezoelectric pillars 12a.

Typically, since the FPCs 15 are bonded by heating with, for example, a heater chip, when the FPCs 15 cool down to room temperatures, the FPCs 15 contract, thus generating stress. If the stress acts on the upper side of the piezoelectric pillars 12a, the most vulnerable, thinnest portion of the piezoelectric pillars may be broken by the stress. Hence, as illustrated in FIG. 14, it is preferable to connect the wiring electrodes 15a of the FPCs 15, which cause the stress, to bottom-side portions lower than the thinnest portions (having the width "f" in the piezoelectric pillars 12a) and closer to the bottom side of the piezoelectric pillars 12a.

Figure 15:
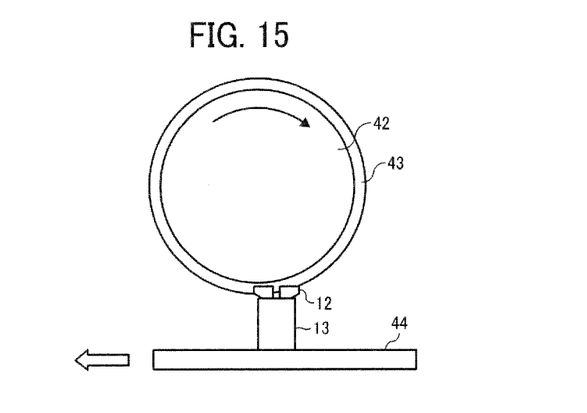
FIG. 15 is a schematic view of components and members used for groove processing.

Next, groove processing is described with reference to FIG. 15.

A dicing blade 43 supported by a flange 42 is rotated clockwise at a speed of, e.g., 30,000 rpm. In groove processing, with the piezoelectric members 12 being bonded to the base member 13 serving as a work and fixed on a jig 44, the piezoelectric members 12 moves to a direction indicated by an arrow in FIG. 15. For example, a dicing saw can easily adjust the positional accuracy at a high precision and is therefore advantageous in processing grooves at minute pitch.

In this configuration, the dicing blade 43 has a shape of generating a greater cutting resistance in the radius direction at an outer circumferential portion than at an inner circumferential portion thereof. Accordingly, the cutting performance of the dicing blade 43 is higher at the bottom side of the piezoelectric pillars 12a through which the outer circumferential portion of the dicing blade 43 passes for a relatively long time, thus facilitating formation of the groove shapes of the above-described exemplary embodiments. The cutting resistance is adjustable by adjusting, for example, the amount of grinder.

In such a case, the width of the bottom side of the grooves 31 may be set greater than the width of the upper side thereof. With such a configuration, discharge routes of, for example, chips generated during processing or water (or lubricant, such as oil) used for processing can be concentrated on deep positions (the bottom side of the piezoelectric pillars 12a) in the depth direction of the grooves. Accordingly, processing load can be received by the bottom-side portions of the piezoelectric pillars 12a, thus preventing inclination of the piezoelectric pillars. Further, for the same reason, the intermediate portions of the piezoelectric pillars having greater widths than the bottom-side portions are preferably formed at positions closer to the bottom side than the center portions in the height direction of the piezoelectric pillars.

The liquid ejection head may be formed as a single head-integrated liquid cartridge (or cartridge-integrated head) with a tank that supplies liquid to the liquid ejection head Next, an image forming apparatus according to an exemplary embodiment of the present disclosure is described with reference to FIGS. 16 and 17.

Figure 16:
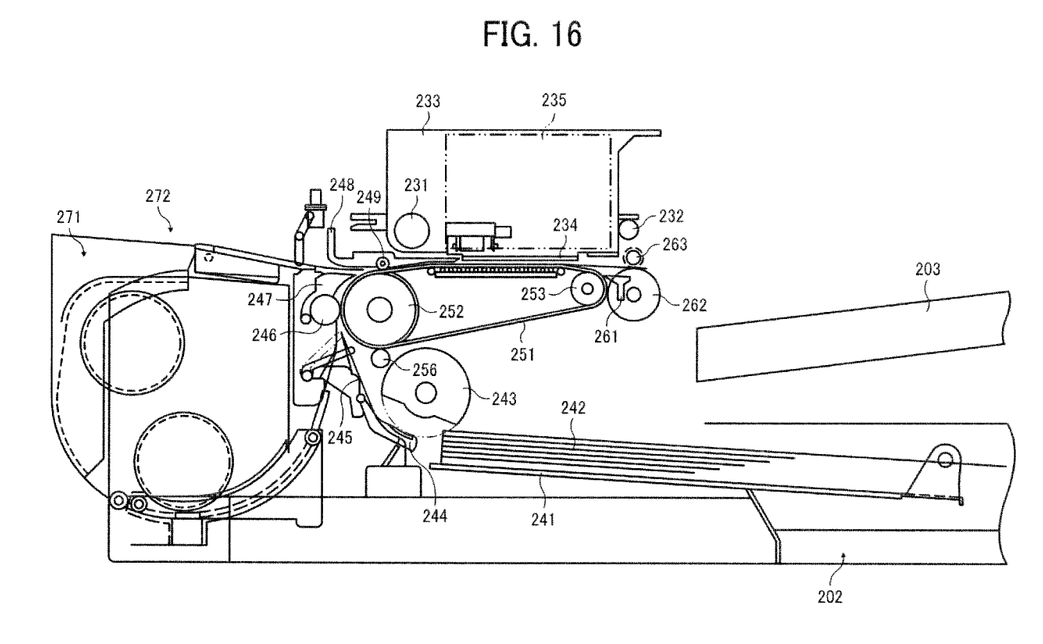
FIG. 16 is a schematic side view of a mechanical section of an image forming apparatus including liquid ejection heads according to an exemplary embodiment of this disclosure.

FIG. 16 is a side view of a schematic configuration of the image forming apparatus. FIG. 17 is a plan view of the image forming apparatus of FIG. 16.

The image forming apparatus is a serial-type image forming apparatus and includes a main left-side plate 221A, a main right-side plate 221B, a main guide rod 231, a sub guide rod 232, and a carriage 233. The main guide rod 2 and the sub guide rod 3 serving as guide members extend between the main side plates 221A and 221B to support the carriage 233. The carriage 233 supported by the main guide rod 1 and the sub guide member is slidable in a main scan direction indicated by a double arrow MSD in FIG. 17. The carriage 233 is reciprocally moved for scanning in the main scan direction MSD by a main scan motor via a timing belt.

On the carriage 233 is mounted a recording head assembly 234 serving as a liquid ejection head unit according to the present exemplary embodiment to eject different ink droplets of, for example, yellow (y), cyan (c), magenta (m), and black (k). The recording head 234 is installed to the carriage 233 so that multiple nozzle rows each including multiple nozzles are arranged parallel to a sub scanning direction (indicated by an arrow SSD illustrated in FIG. 17) perpendicular to the main scan direction MSD and ink droplets are ejected downward from the nozzles.

The recording head assembly 234 includes a liquid ejection head 234a, a liquid ejection head 234b, and a base member. Each of the liquid ejection head 234a and the liquid ejection head 234b includes, for example, two nozzle rows and is mounted to the base member. For example, the liquid ejection head 234a ejects black ink droplets from one of the nozzle rows and cyan ink droplets from the other of the nozzle rows, and the liquid ejection head 234b ejects magenta ink droplets from one of the nozzle rows and yellow ink droplets from the other of the nozzle rows. In the above-description, the recording head assembly 234 has two heads for ejecting liquid droplets of four colors. However, it is to be noted that the recording head assembly 234 may be include, for example, four liquid ejection heads for separately eject ink droplets of four different colors.

On the carriage 233 are mounted sub tanks 235a and 235b (collectively referred to as sub tanks 235 unless distinguished) to supply different color inks corresponding to the respective nozzle rows of the recording head assembly 234. A supply unit 224 replenishes different color inks from corresponding ink cartridges 210 to the sub tanks 235 via supply tubes 236 for the respective color inks.

The image forming apparatus further includes a sheet feed section that feeds sheets 242 stacked on a sheet stack portion (platen) 241 of a sheet feed tray 202. The sheet feed section further includes a sheet feed roller 243 that separates the sheets 242 from the sheet stack portion 241 and feeds the sheets 242 sheet by sheet and a separation pad 244 that is disposed opposing the sheet feed roller 243. The separation pad 244 is made of a material of a high friction coefficient and biased toward the sheet feed roller 243.

To feed the sheet 242 from the sheet feed section to a portion below the recording head assembly 234, the image forming apparatus includes a first guide member 245 that guides the sheet 242, a counter roller 246, a conveyance guide member 247, a press member 248 including a front-end press roller 249, and a conveyance belt 251 that conveys the sheet 242 to a position facing the recording head assembly 234 with the sheet 242 electrostatically attracted thereon.

The conveyance belt 251 is an endless belt that is looped between a conveyance roller 252 and a tension roller 253 so as to circulate in a belt conveyance direction, that is, the sub-scan direction SSD. A charge roller 256 is provided to charge the surface of the conveyance belt 251. The charge roller 256 is disposed to contact the surface of the conveyance belt 251 and rotated by the circulation of the conveyance belt 251. By rotating the conveyance roller 252 by a sub-scan motor, not illustrated, via a timing roller, the conveyance belt 251 circulates in the belt conveyance direction SSD illustrated in FIG. 17.

The image forming apparatus further includes a sheet output section to output the sheet 242 having an image formed by the recording heads 234. The sheet output section includes a separation claw 261 to separate the sheet 242 from the conveyance belt 251, a first output roller 262, a second output roller 263, and the sheet output tray 203 disposed below the first output roller 262.

A duplex unit 271 is removably mounted on a rear portion of the image forming apparatus. When the conveyance belt 251 rotates in reverse to return the sheet 242, the duplex unit 271 receives the sheet 242 and turns the sheet 242 upside down to feed the sheet 242 between the counter roller 246 and the conveyance belt 251. At the top face of the duplex unit 271 is formed a manual-feed tray 272.

Figure 17:
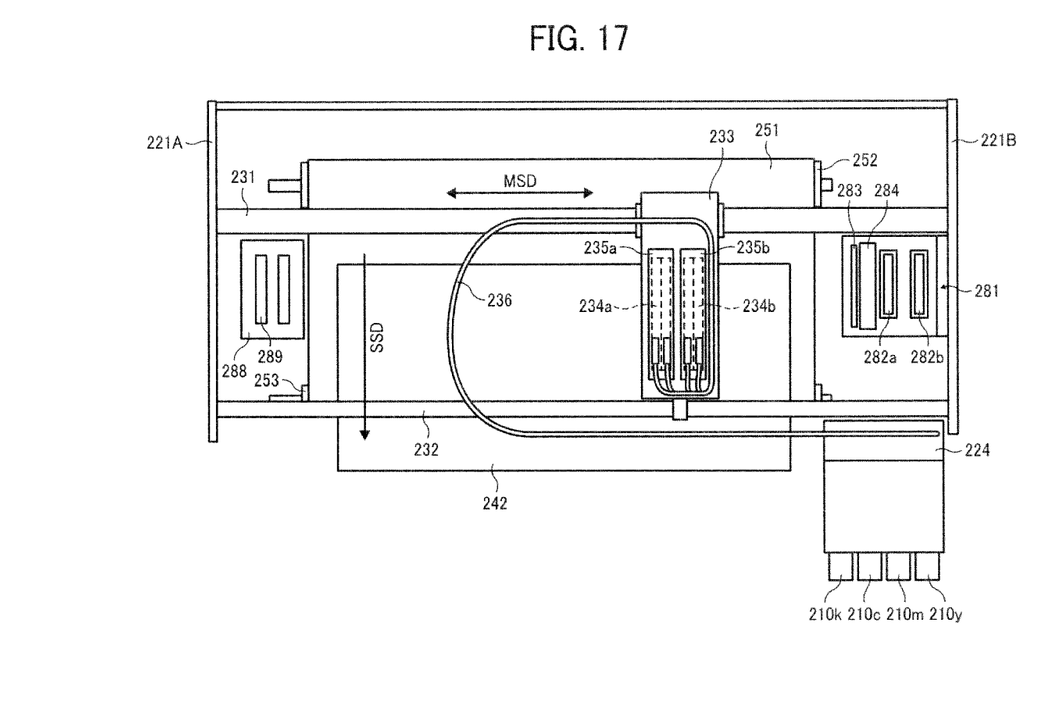
FIG. 17 is a schematic plan view of the mechanical section of FIG. 16.

In FIG. 17, at a non-print area on one end in the main-scan direction MSD of the carriage 233 is disposed a maintenance unit 281 to maintain and recover conditions of the nozzles of the recording head assembly 234. The maintenance unit 281 includes cap members 282a and 282b (hereinafter collectively referred to as "caps 282" unless distinguished) to cover nozzle faces of the recording head assembly 234, a wiping blade 283 serving as a blade member to wipe the nozzle faces of the recording head assembly 234, and a first droplet receptacle 284 to store ink droplets during maintenance ejection performed to discharge increased-viscosity ink.

In FIG. 17, a second droplet receptacle 288 is disposed at a non-print area on the other end in the main-scan direction MSD of the carriage 233. The second droplet receptacle 288 stores increased-viscosity ink or other non-recorded ink droplets discharged during recording (image forming) operation and so forth. The second droplet receptacle 288 has openings 289 arranged in parallel with the nozzles rows of the recording head assembly 234.

In the image forming apparatus having the above-described configuration, the sheets 242 are separated sheet by sheet from the sheet feed tray 202, fed in a substantially vertically upward direction, guided along the first guide member 245, and conveyed with sandwiched between the conveyance belt 251 and the counter roller 246. Further, the front tip of the sheet 242 is guided with the conveyance guide 247 and pressed with the front-end press roller 249 against the conveyance belt 251 so that the traveling direction of the sheet 242 is turned substantially 90 angle degrees.

At this time, plus outputs and minus outputs, i.e., positive and negative supply voltages are alternately applied to the charge roller 256 so that the conveyance belt 251 is charged with an alternating voltage pattern, that is, an alternating band pattern of positively-charged areas and negatively-charged areas in the sub-scanning direction SSD, i.e., the belt circulation direction. When the sheet 42 is fed onto the conveyance belt 251 alternately charged with positive and negative charges, the sheet 242 is electrostatically attracted on the conveyance belt 251 and conveyed in the sub-scanning direction SSD by circulation of the conveyance belt 251.

By driving the recording head assembly 234 in response to image signals while moving the carriage 233, ink droplets are ejected on the sheet 242 stopped below the recording head assembly 234 to form one band of a desired image. Then, the sheet 242 is fed by a certain amount to prepare for recording another band of the image. Receiving a signal indicating that the image has been recorded or the rear end of the sheet 242 has arrived at the recording area, the recording head assembly 234 finishes the recording operation and outputs the sheet 242 to the sheet output tray 203.

As described above, the image forming apparatus includes the liquid ejection head unit according to the present exemplary embodiment, thus obtaining high-quality images.

Figure 18:
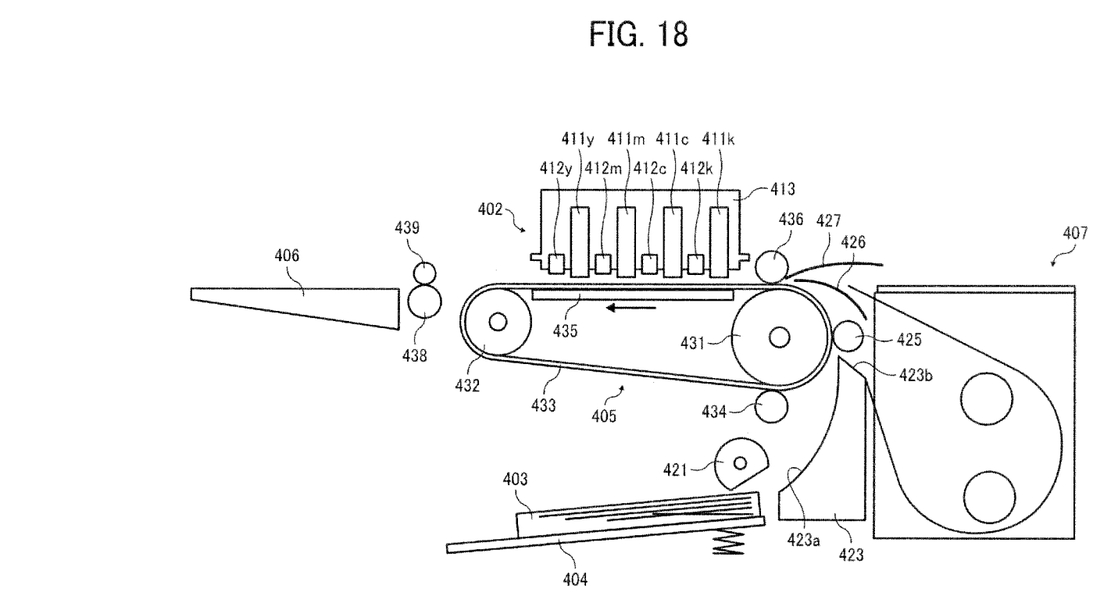
FIG. 18 is a schematic side view of an image forming apparatus according to another exemplary embodiment of this disclosure.

Next, an image forming apparatus according to another exemplary embodiment including the liquid ejection head unit is described with reference to FIG. 18. FIG. 18 is a schematic side view illustrating a mechanical section of the image forming apparatus.

In FIG. 18, the image forming apparatus is illustrated as a line-head-type image forming apparatus and includes, an image forming section 402, a sheet feed tray 404, a conveyance unit 405, and a sheet output tray 406. A plurality of recording sheets 403 is stacked on the sheet feed tray 404 at a lower portion of the image forming apparatus. When the recording sheet 403 is fed from the sheet feed tray 404, the image forming section 402 records an image on the recording sheet 403 conveyed by the conveyance unit 405, and then the conveyance unit 405 outputs the recording sheet 403 to the sheet output tray 406 mounted on a lateral side of the image forming apparatus.

A duplex unit 407 is removably mountable to the image forming apparatus. In double-face printing, when printing on one face of the recording sheet 403 is finished, the sheet 403 is turned upside down by the conveyance unit 405 and sent into the duplex unit 407. Accordingly, the duplex unit 407 feeds the other face of the sheet 403 as a printable face to the conveyance unit 405 again. The image forming section 402 records an image on the other face of the sheet 403 and outputs the sheet 403 to the sheet output tray 406.

Figure 14:
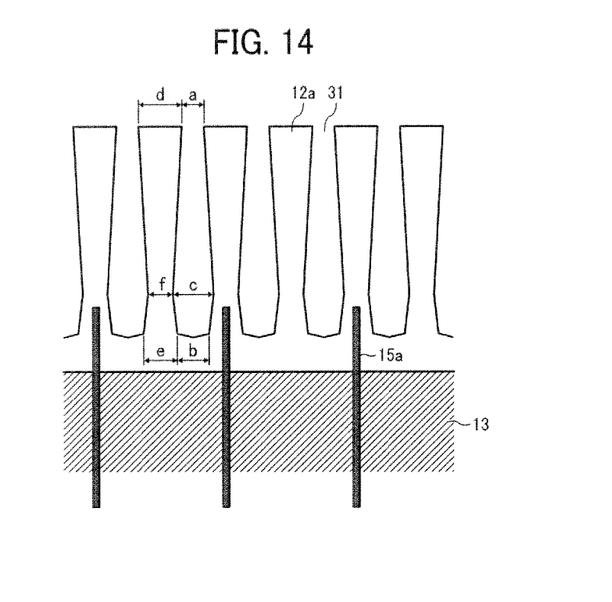
FIG. 14 is an enlarged front view of another example of a piezoelectric actuator connected to a power feed member.

The image forming section 402 includes, for example, full-line type recording heads 411K, 411C, 411M, and 411Y (hereinafter, referred to as "recording heads 411" unless colors are distinguished) as illustrated in FIG. 14. The full-line type recording heads 411Y, 411M, 411C, and 411K are formed with a plurality of liquid-ejection heads according to this exemplary embodiment to eject ink droplets of corresponding different colors: black (K), cyan (C), magenta (M), and yellow (Y). Each of the recording heads 411 is installed to a head holder 413 so that a nozzle face of each recording head having nozzles through which ink droplets are ejected is oriented downward.

The image forming apparatus includes maintenance units 412K, 412C, 412M, and 412Y (hereinafter, referred to as "maintenance units 412" unless colors are distinguished) that are provided corresponding to the recording heads 411K, 411C, 411M, and 411Y to maintain and recover the ejection performance of the liquid ejection heads. In maintenance operations such as purging and wiping, the recording heads 411 and the corresponding maintenance units 412 are relatively shifted so that the nozzle faces of the recording heads 411 oppose capping members and/or other members of the corresponding maintenance units 412.

In FIG. 18, the recording heads 411 are arranged to eject ink droplets in the order of black, cyan, magenta, and yellow from an upstream side in the sheet conveyance direction. It is to be noted that the arrangement order of the recording heads and the number of ink colors are not limited to the above-described arrangement and number and may be any other suitable arrangement and number. Further, as the line-head-type head, one or more recording heads in which multiple nozzle rows each having nozzles to eject different color droplets are arrayed at a predetermined interval may be used. The one or more recording heads may be formed as an single integrated unit with a liquid cartridge(s) that supplies ink to the heads.

The sheets 403 stacked on the sheet feed tray 404 are separated with a sheet feed roller 421 and a separation pad, not illustrated, and fed sheet by sheet toward a conveyance guide member 423. The sheet 403 is sent between a registration roller 425 and a conveyance belt 433 along a guide face 423a of the conveyance guide member 423, and sent at a proper timing onto the conveyance belt 433 of the conveyance unit 405 along a second guide member 426.

The conveyance guide member 423 also has a second guide face 423b to guide the sheet 403 sent from the duplex unit 407. The image forming apparatus includes a third guide member 427 to guide the sheet 403 having been returned from the conveyance unit 405 to the duplex unit 407 in duplex printing.

The conveyance unit 405 includes the conveyance belt 433 that is an endless belt looped between a conveyance roller 431 and a driven roller 432, a charge roller 434 to charge the conveyance belt 433, a platen member 435 to maintain flatness of a portion of the conveyance belt 433 facing the image forming section 402, a press roller 436 to press the recording sheet 403 sent from the conveyance belt 433 against the conveyance roller 431, and a cleaning roller formed with a porous member to remove residual ink adhered on the conveyance belt 433.

At the downstream side of the conveyance unit 405 is disposed a sheet output roller 438 and a spur 439 to send the recording sheet 403, on which an image has been recorded, to the sheet output tray 406.

In the image forming apparatus of such a configuration, the conveyance belt 433 is circulated in a direction indicated by an arrow in FIG. 18 and charged by contacting the charge roller 434 to which a high-potential voltage is supplied. When the sheet 403 is conveyed onto the conveyance belt 433 charged, the sheet 403 is attracted on the conveyance belt 433. Thus, such strong attachment of the sheet 403 against the conveyance belt 433 prevents curling and surface irregularity of the sheet 403, thus forming a highly flattened face.

When the sheet 403 is moved by circulating the conveyance belt 433, the recording head units 411 eject droplets of recording liquid to form an image on the sheet 403. After image recording, the sheet 403 is outputted by the output roller 438 to the sheet output tray 406.

As described above, the image forming apparatus includes the liquid-ejection head unit according to an exemplary embodiment of this disclosure, thus allowing high-speed formation of high-quality images.

In the above-described exemplary embodiments, the image forming apparatus is described as printers. However, it is to be noted that the image forming apparatus is not limited to such printers and may be, for example, a multifunctional device having two or more capabilities of a printer, a facsimile machine, and a copier. Further, the image forming apparatus may be an image forming apparatus using, for example, a recording liquid other than "ink" in strict meaning or a fixing solution.

Numerous additional modifications and variations are possible in light of the above teachings. It is therefore to be understood that, within the scope of the appended claims, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A piezoelectric actuator, comprising a piezoelectric member having piezoelectric pillars and grooves alternately arrayed,
   each of the grooves having a first width at a bottom side of the piezoelectric pillars and a second width at an upper side of the piezoelectric pillars in a direction in which the piezoelectric pillars are arrayed, the first width being greater than the second width, and
   each of the piezoelectric pillars having a greater width at the upper side of the piezoelectric pillars than at the bottom side of the piezoelectric pillars.

2. The piezoelectric actuator according to claim 1, wherein each of the grooves comprises an intermediate portion having a third width greater than the first width.

3. The piezoelectric actuator according to claim 1, wherein the piezoelectric member has internal electrodes and piezoelectric materials laminated in a height direction of the piezoelectric pillars.

4. The piezoelectric actuator according to claim 1, further comprising a power feed member connected to an area of the piezoelectric pillars from a center of the piezoelectric pillars to the bottom side of the piezoelectric pillars in the height direction of the piezoelectric pillars.

5. The piezoelectric actuator according to claim 1, wherein the width, at the upper side of the piezoelectric pillars, of each piezoelectric pillar amongst the piezoelectric pillars is greater than the second width, at the upper side of the piezoelectric pillars, of each groove amongst the grooves.

6. The piezoelectric actuator according to claim 2, wherein the intermediate portion of the grooves is disposed between a center of the piezoelectric pillars and the bottom side of the piezoelectric pillars in a height direction of the piezoelectric pillars.

7. The piezoelectric actuator according to claim 2, further comprising a power feed member connected to an area of the piezoelectric pillars from the intermediate portion of the grooves to the bottom side of the piezoelectric pillars in the height direction of the piezoelectric pillars.

8. A liquid ejection head comprising a piezoelectric actuator having a piezoelectric member,
   the piezoelectric member having piezoelectric pillars and grooves alternately arrayed,
   each of the grooves having a first width at a bottom side of the piezoelectric pillars and a second width at an upper side of the piezoelectric pillars in a direction in which the piezoelectric pillars are arrayed, the first width being greater than the second width, and
   each of the piezoelectric pillars having a greater width at the upper side of the piezoelectric pillars than at the bottom side of the piezoelectric pillars.

9. The liquid ejection head according to claim 8, wherein the width, at the upper side of the piezoelectric pillars, of each piezoelectric pillar amongst the piezoelectric pillars is greater than the second width, at the upper side of the piezoelectric pillars, of each groove amongst the grooves.

10. An image forming apparatus comprising a liquid ejection head having a piezoelectric actuator, the piezoelectric actuator having a piezoelectric member, the piezoelectric member having piezoelectric pillars and grooves alternately arrayed,
    each of the grooves having a first width at a bottom side of the piezoelectric pillars and a second width at an upper side of the piezoelectric pillars in a direction in which the piezoelectric pillars are arrayed, the first width being greater than the second width, and
    each of the piezoelectric pillars having a greater width at the upper side of the piezoelectric pillars than at the bottom side of the piezoelectric pillars.

11. The image forming apparatus according to claim 10, wherein the width, at the upper side of the piezoelectric pillars, of each piezoelectric pillar amongst the piezoelectric pillars is greater than the second width, at the upper side of the piezoelectric pillars, of each groove amongst the grooves.

* * * * *